United States Patent [19]

Bailis et al.

[11] Patent Number: 6,053,760

[45] Date of Patent: Apr. 25, 2000

[54] UNIVERSAL DEVICE FOR MOUNTING CIRCUIT CARDS IN A COMPUTER OR LIKE ELECTRICAL MACHINE

[75] Inventors: Robert Thomas Bailis, Cary; Thomas Lee Bonds, Jr.; David John Jensen, both of Raleigh; Charles Steven Lingafelt, Durham; Brian Scott Oakley, Burlington, all of N.C.

[73] Assignee: International Business Machines Corporation, Armonk, N.Y.

[21] Appl. No.: 09/092,788

[22] Filed: Jun. 5, 1998

[51] Int. Cl.[7] ............................................ H01R 13/64
[52] U.S. Cl. ............................................ 439/377; 361/690
[58] Field of Search .............................. 439/377, 64, 342, 439/377.2, 76.1; 361/395, 692, 690

[56] References Cited

U.S. PATENT DOCUMENTS

| | | |
|---|---|---|
| 3,017,232 | 1/1962 | Schwab et al. . |
| 3,711,814 | 1/1973 | Pomella et al. ............................ 339/65 |
| 3,869,185 | 3/1975 | Teagno ...................................... 339/65 |
| 4,445,740 | 5/1984 | Wallace ..................................... 339/45 |
| 4,789,352 | 12/1988 | Kreinberg et al. ....................... 439/260 |
| 4,941,840 | 7/1990 | Okada ....................................... 439/376 |
| 5,099,391 | 3/1992 | Maggelet et al. ........................ 361/395 |
| 5,238,423 | 8/1993 | Hillis et al. .............................. 439/259 |
| 5,302,136 | 4/1994 | St. Germaine et al. ................. 439/376 |
| 5,315,479 | 5/1994 | Bartilson ................................... 439/692 |
| 5,317,481 | 5/1994 | Hillis et al. .............................. 361/796 |
| 5,325,269 | 6/1994 | Someno ..................................... 361/796 |
| 5,363,281 | 11/1994 | Baitz et al. ............................... 361/801 |
| 5,366,385 | 11/1994 | Treleaven .................................. 439/377 |
| 5,868,585 | 2/1999 | Barthel et al. ............................ 439/377 |

OTHER PUBLICATIONS

U.S. application No. 08/764,963, IBM Docket PO996–102, filed Dec. 13, 1996.

*Primary Examiner*—Michael L. Gellner
*Assistant Examiner*—Antoine Ngandjui
*Attorney, Agent, or Firm*—Joscelyn G. Cockburn

[57] ABSTRACT

The device includes a universal carrier plate with openings for cooling attached circuit boards and openings for coacting with brackets to mount different size circuit boards. A positioning mechanism is connected to the universal carrier plate and rides on tracks in the housing to position the carrier plate and its attached circuit board.

18 Claims, 7 Drawing Sheets

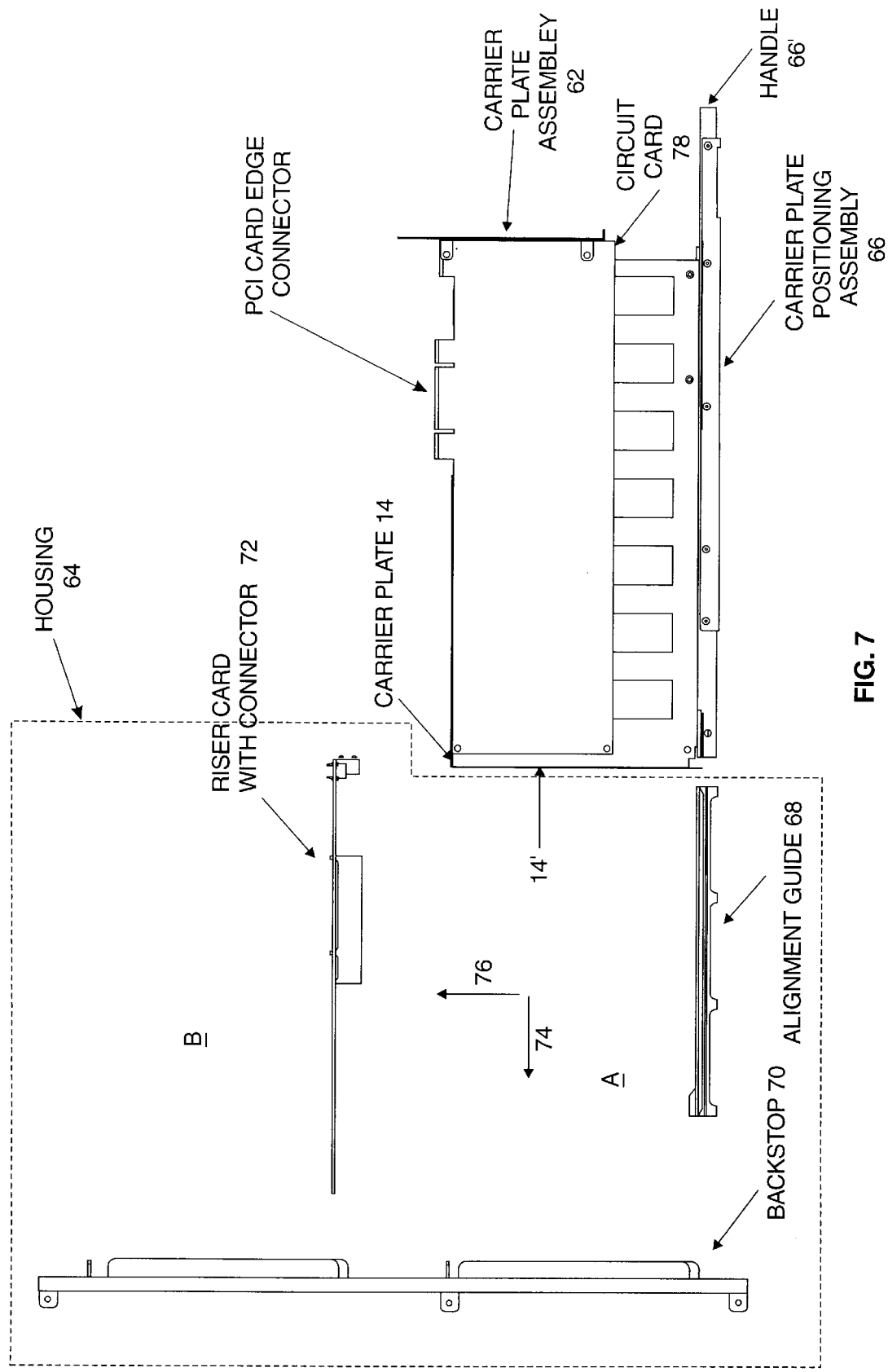

UNIVERSAL DEVICE FOR MOUNTING CIRCUIT CARDS IN A COMPUTER OR LIKE ELECTRICAL MACHINE

CROSS-REFERENCE TO RELATED PATENT APPLICATION

U.S. Pat. No. 5,868,585, appl. Ser. No. 08/764,963, filed Dec. 13, 1996, relates to an actuator and retainer frame assembly for inserting and removing printed circuit cards into and from electrical machines.

U.S. Pat. No. 5,751,559, appl. Ser. No. 08/728,295, filed Oct. 8, 1996 relates to a plug-in package, including carrier plate with pins, handle and circuit card, for use in electrical machines.

U.S. Patent Appl. No. 09/092,169, filed concurrently herewith relates to an insertion device.

The patent applications are assigned to the assignee of the present invention.

BACKGROUND OF THE INVENTION

1. Field of the Invention

The present invention relates to electrical machines in general and, in particular, to plates that support printed circuit cards to be plugged into connectors in the machine.

2. Prior Art

The current trend in the electronics industry is to reduce the cost of boxes such as Personal Computers (PC) and other electronic devices. The total cost of a product includes both the initial purchase price and the cost for servicing and maintaining the product. It is well known that the low cost quality products stand the best chance of being successful.

One way to reduce product cost is to modularize the product. Further cost reduction can be achieved if the product is built to a standard specification. Several specifications have been promulgated for different sectors of the electronic industry. The benefit of the specification is that sub-assemblies can be purchased from different manufactures and used in a pre-existing machine or assembled into a new one.

The modularization used in the electronic industry usually requires a unit (hereinafter called a box) be modularized into sub-assemblies of a housing and circuit cards or circuit board assemblies to be mounted in the housing. The sub-assembly usually includes a frame (for mounting in the housing) and the circuit card or circuit board that the frame holds.

U.S. Pat. No. 3,775,643 describes a card support assembly for plugged-in PC cards. Different card support assemblies are required for different size PC cards. In addition, the mounting plate to which the card support assembly is attached also has to be changed to accommodate changes in the card support assembly.

Probably the foremost drawback with the card support assembly is that it can only support one type of PC card. Consequently, it violates one of the cardinal principles of low-cost manufacturing. The cardinal principle is re-useability of sub-assemblies. The advantages (including reduced cost, etc.) associated with re-useability of sub-assemblies are also well known and they will not be repeated here.

U.S. Pat. No. 5,432,682 describes a card support assembly (consisting of a mounting bracket and card bracket holder) for mounting variable length AT style cards in a computer housing. The orientation of the card is such that the card edge connector (during insertion) is perpendicular to the connector in which it is to be inserted. Stated another way, the direction of insertion into the housing is perpendicular to the direction of insertion in the connector. Even though the design of this card support assembly is a step in the right direction in that it handles different size cards, it suffers, among other things, from the infirmity of its inability to insert circuit cards in which the direction of insertion in the housing is different from the direction of insertion in the in house connector.

U.S. Pat. No. 5,490,038 describes a mounting plate for mounting different size motherboard to a chassis. This is a limited use structure only suited for the disclosed use.

In view of the above limitations, there is a need for a more versatile structure for mounting circuit cards or boards in their respective housings.

SUMMARY OF THE INVENTION

It is, therefore, an object of the present invention to provide a more versatile mounting structure than was heretofore been possible.

It is another object to provide a structure suitable to mount PCI (Peripheral Component Interconnect) adapter cards designed to comply with the mechanical specifications set forth in the PCI Local Bus Specification.

It is still another object of the present invention to provide a structure that allows a card to be inserted in an in-house connector in a direction traverse to the direction in which the card is inserted in the housing.

It is yet another feature of the present invention to provide a common structure to insert different types of circuit cards.

The universal carrier plate includes a substantially flat, planner member with side walls along at least two sides. The side wall on at least one of the two side walls is provided with an opening through which the edge connector on a circuit card that is being mounted is positioned for insertion into an in-house connector. A plurality of special mounting holes, provided on the planner member, are used to attach the card carrier to a mechanism that mounts card into a machine housing. A plurality of stand-offs are positioned about the periphery of the planar member. The stand-offs coact with fasteners to mount different size cards on the planar.

In one embodiment of the invention, a plurality of slots are placed on one of the side wall on either side and in proximity to the opening. The slots coact with extender brackets to mount different types of cards onto the planar.

In another feature of the invention, a plurality of cooling holes are fabricated into the planar.

The foregoing features and advantages of the invention will be more fully described in the accompanying drawings.

BRIEF DESCRIPTION OF THE DRAWINGS

FIG. 7 shows a schematic of an electrical machine and the Universal Carrier Plate Assembly poised to be inserted in the housing of the machine.

DETAILED DESCRIPTION OF THE PREFERRED EMBODIMENT

Figure 1:
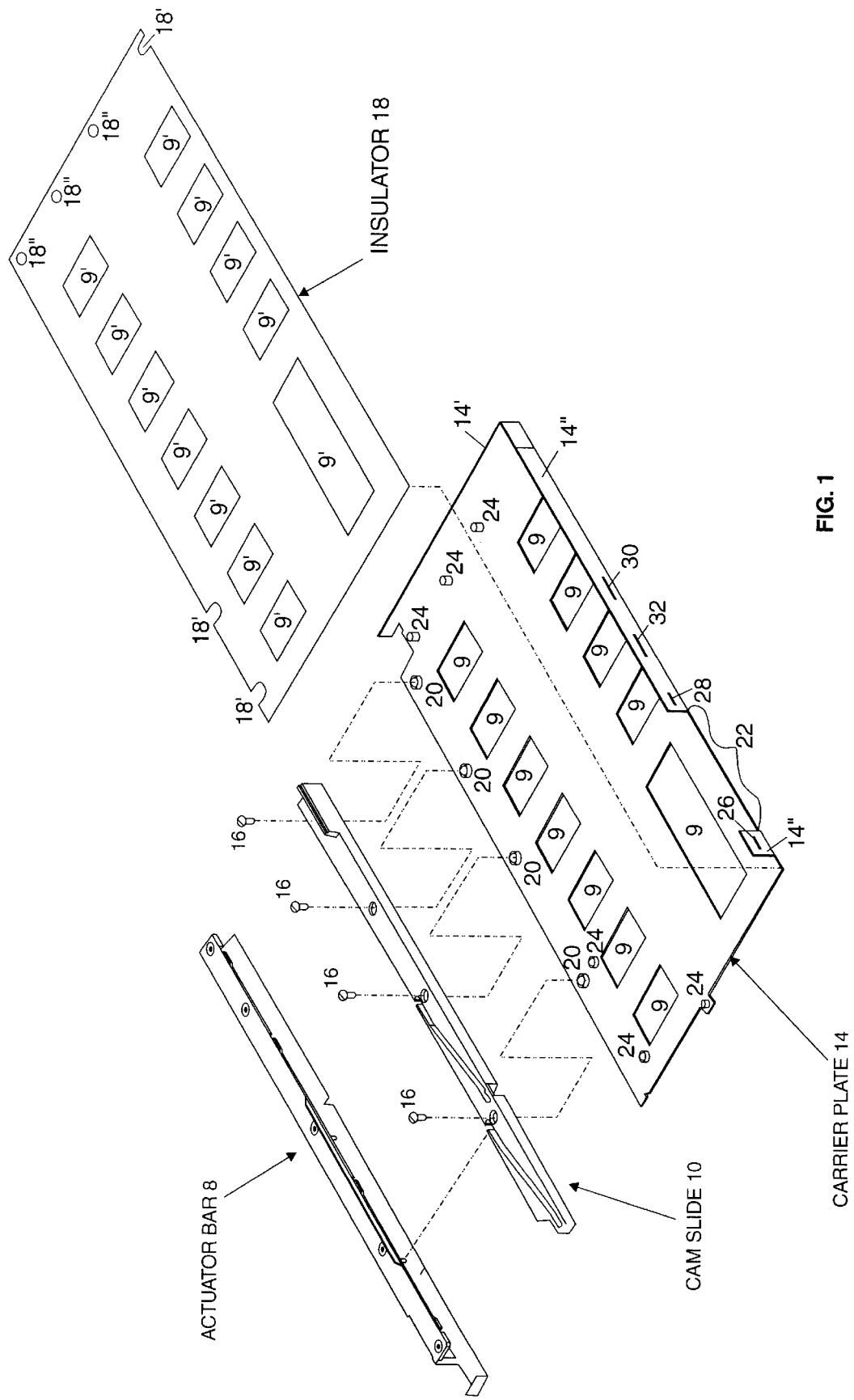
FIG. 1 shows an exploded isometric view of the universal carrier plate and the insulator according to the teachings of the present invention.

FIG. 7 shows a schematic of an electrical machine, such as a computer, with Carrier Plate Assembly 62 positioned to be inserted in the electrical machine. The electrical machine includes Housing 64, Riser Card with Connector 72, Backstop 70 and Alignment Guide 68. The Backstop 70, Alignment Guide 68 and Riser Card with Connector 72 are operatively connected to Housing 64. It should be noted that in this electrical machine, the riser card with Connector 72 partitions the electrical machine into two cavities labeled A and B in which Carrier Plate Assembly 62 or similar assembly can be inserted. Since the assemblies that are inserted in either cavity are identical, only one will be described in this illustration. The Carrier Plate Assembly 62 includes Carrier Plate 14 to which Circuit Card or Board 78 is attached. Preferably, the Circuit Card 78 is a PCI card with PCI card edge connector protruding from an opening in a side of the Carrier Plate 14. The Carrier Plate 14 is connected to Carrier Plate Positioning Assembly 66. The Carrier Plate Positioning Assembly 66 includes a Handle 66'. More detailed description of the Carrier Plate Positioning Assembly 66 is given below. Suffice it to say at this point that the Carrier Plate Positioning Assembly 66 includes an actuator bar with pins disposed to ride in slots of a CAM slide. The actuator bar CAM slide assembly is disposed to ride within the Alignment Guide 68. In operation, the Carrier Plate Assembly 62 and the connected Carrier Plate Positioning Assembly 66 is fitted in the box or housing with the actuator bar riding in the Alignment Guide 68. The assembly is pushed in the direction shown by arrow 74 until the leading edge 14' of Carrier Plate 14 contacts Backstop 70. At this point, as force is applied to Handle 66, the actuator bar moves relative to the CAM slide until the PCI card edge connector is aligned with the connector on the Riser Card 72. Continued force applied to Handle 66 forces the PCI card edge connector into the connector which is connected to the riser card. In order to force the PCI card edge connector to be inserted in the connector on the riser card, the edge connector moves in the direction shown by arrow 76. More details of the assembly described in FIG. 7 is set forth in the above-identified application and is incorporated herein by reference. It should be noted that even though a specific Carrier Plate Positioning Assembly 66 is used for positioning the Carrier Plate 14 and the attached card in the housing, other types of positioning assemblies and different size cards could be used without deviating from the spirit or teachings of the present invention.

The universal carrier plate (FIG. 1), according to the teachings of the present invention, includes Carrier Plate 14, Fastening Devices 16 and 20, and Insulator 18. Preferably, the Carrier Plate 14 is fabricated from metal and the Insulator 18 is fabricated from a non-metallic material and insulates the circuit card (not shown) from the metal carrier plate. The Carrier Plate 14 is fabricated from a relatively flat and relatively thin metal with Endwall and Sidewall 14' and 14", respectively. The endwall and sidewall function as stops for retaining circuit boards (not shown) that are mounted on the Carrier Plate 14. A plurality of Mounting Holes 20 are fabricated along one side of the Carrier Plate 14. Fastening members such as Screw 16 coact with the mounting holes 20 to attach the carrier plate to the CAM slide 10. It should be noted that other types of fastening mechanisms can be used for attaching the Carrier Plate 14 to the CAM slide.

The CAM slide 10 and Actuator Bar 8 form the mechanism that coact with the carrier plate to insert a circuit card or circuit board into the housing of a computer or similar electrical machine. In addition, other types of positioning mechanisms other than the actuator bar 8 and the CAM slide 10 can be used for positioning the carrier plate and its attached circuit board (not shown) within the housing of the electrical machine.

Still referring to FIG. 1, the Sidewall 14" includes an opening identified by numeral 22. When a circuit card (not shown) is mounted on the Carrier Plate 14, the edge connector on the circuit card protrudes through Opening 22 into the connector which is mounted inside of a machine housing. A plurality of openings 9 are fabricated in the Carrier Plate 14. The openings provide air to cool the circuit card which is mounted on the Carrier Plate 14. A plurality of stand-offs, identified by numerals 24 are fabricated in the Carrier Plate 14. Preferably, the stand-offs are grooved or threaded and coact with the screws or other types of fastening means for attaching different sizes of circuit cards on the carrier plate. A pair of slots, identified by numerals 26 and 28, are fabricated in Sidewall 14" on either side of Opening 22. As will be discussed in greater below, the slots 26 and 28 coact with brackets to mount a Type 5 AIB card to the Carrier Plate 14. A second set of openings 30 and 32 are fabricated in spaced relationship on Sidewall 14". The openings 30 and 32 coact with a bracket for mounting a short PCI card. Insulator 18 is fabricated with a plurality of cooling holes 9' matching those previously described on the Carrier Plate 14. A plurality of cut-outs 18' and circular openings 18" are fabricated in the Insulator 18. The cut-outs and openings are such that they are in alignment with respective stand-ups on the carrier plate when the Insulator 18 is mounted in the carrier plate.

Before further discussing some of the types of circuit cards that can be mounted on the universal carrier plate, the standard to which the carrier plate is built is worthwhile identifying and discussing. The standard is set forth in the PCI Local Bus Specification, which is incorporated herein by reference. In particular, Chapter 5 of the PCI Local Bus Specification sets forth the mechanical specification for designing PCI cards. The carrier plate is designed so as to support any card designed to comply with the PCI Local Bus Specification. In addition, because of the layout of this Carrier Plate 14, other types of card not designed to the standard could also be mounted on the carrier plate. In other words, this carrier plate is universal and support cards designed in compliance with the PCI Local Bus Specification and cards not designed to the standard.

Figure 2:
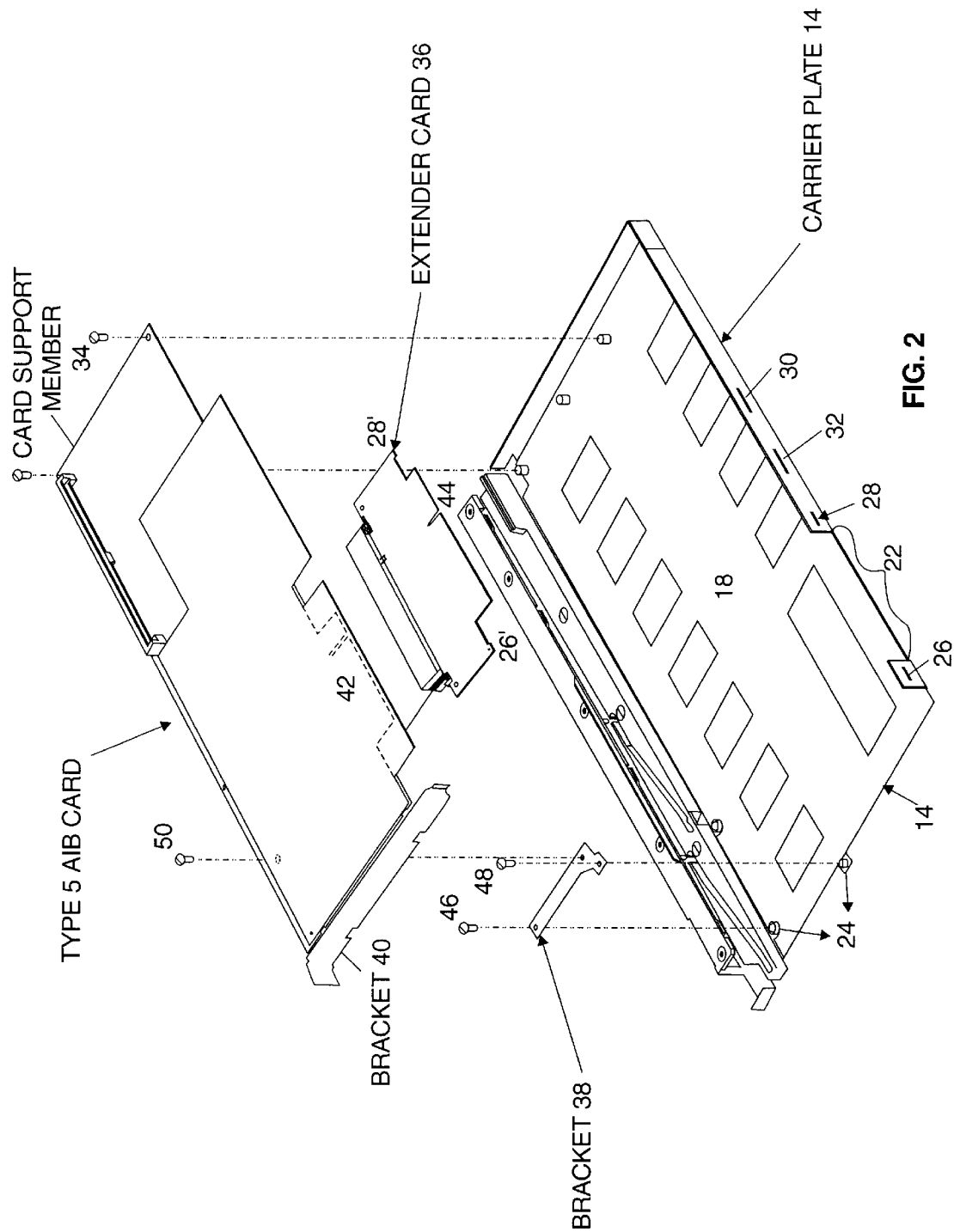
FIG. 2 shows an exploded view for a Type 5 AIB card assembly.

FIG. 2 shows a Type 5 AIB card and hardware for mounting the card to the Carrier Plate 14. For brevity, components which are common to those previously described in FIG. 1 and can be easily identified are not identified or discussed relative to FIG. 2. In addition, components which are common to previously described components are identified by the same numeral. The hardware for mounting the Type 5 AIB card includes Card Support Member 34, Extender Card 36, Bracket 38 and Bracket 40. The Type 5 AIB card is mounted on Card Support Member 34 and has a card edge connector identified with numeral 42. Because the Card Edge Connector 42 recedes from the edge of Support Member 34, an Extender Card 36 is fitted onto Card Support Member 34 and extends the card edge connector via the Extender Connector 44. When the Type 5 AIB card is assembled on the carrier plate, the Connector 44 on the extender card coact with the connector (not shown) mounted inside of the machine housing. The Bracket 40 is attached to the Card Support Member 34 and Bracket 38 is mounted by Screws 46 and 48 to Stand-off 24. Screw 50 attaches the Type 5 AIB card and its Card Support Member 34 to the Bracket 38. When the Type 5 AIB card is assembled, the card edge connector in the Extender Card 44 protrudes through Opening 22 into the connector mounted in the housing (not shown). Members 26' and 28' are inserted through Holes 26 and 28, respectively. Likewise, Screws 46 and 48 hold the bracket firmly against the Carrier Plate 14 by threading through Stand-off 24. The Insulator 18 is fitted on the Carrier Plate 14 and insulators carrier plate from the Type 5 AIB card.

Figure 3:
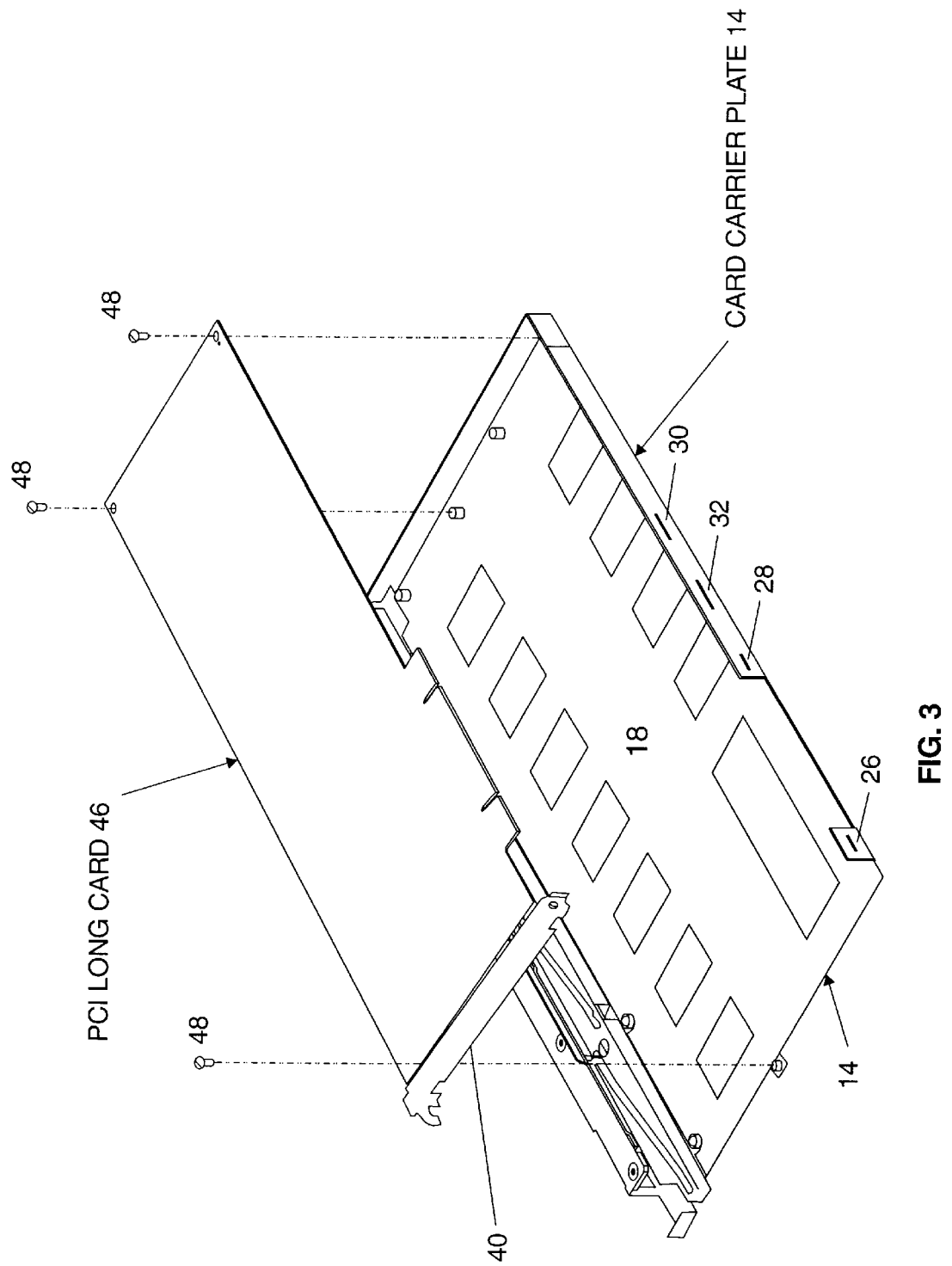
FIG. 3 shows an exploded view for a PCI Long Card Assembly.

FIG. 3 shows a configuration for the PCI long card. The Bracket 40 is attached to the PCI Long Card 46 and Screws 48 mates with stand-offs on the carrier plate to hold the PCI long card firmly against the carrier plate and the inserted Insulator 18.

Figure 4:
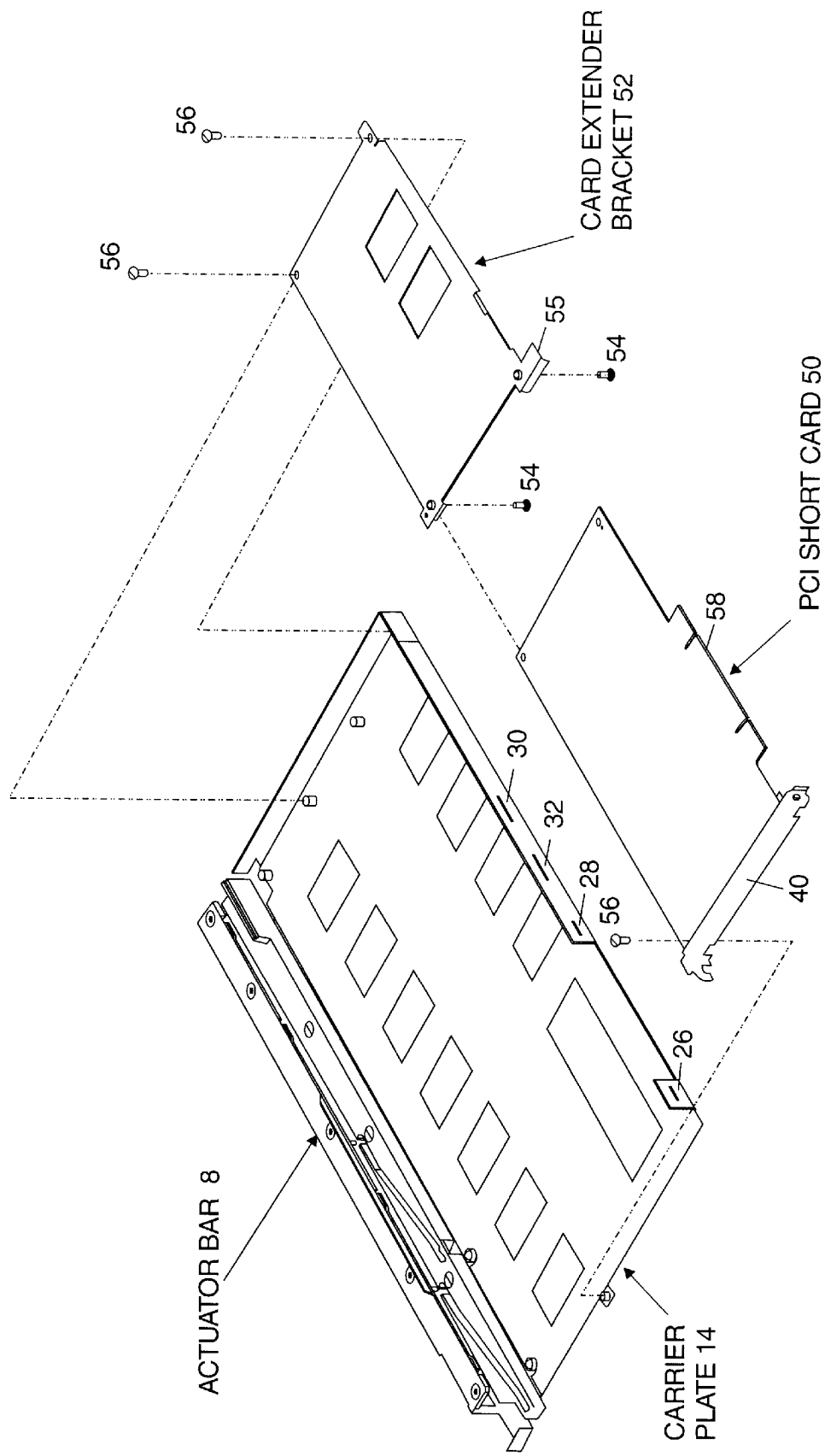
FIG. 4 shows an exploded view for a PCI Short Card Assembly.
Figure 5:
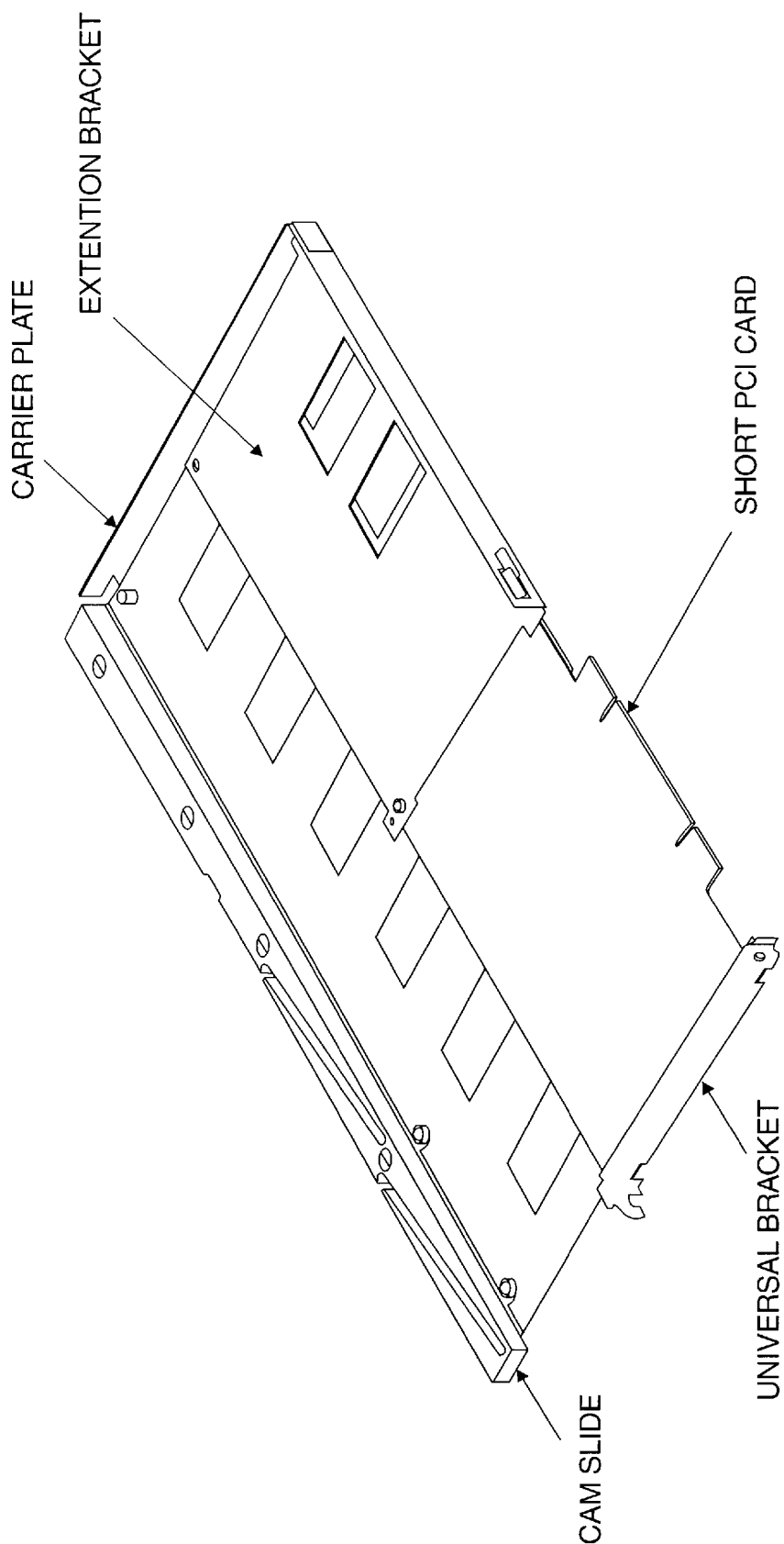
FIG. 5 shows the PCI Short Card Assembly.

FIG. 4 shows an exploded view of PCI short card 50 and card extender bracket 52 for mounting the card to the Carrier Plate 14. The Bracket 40 is connected to the PCI Short Card 50 and the Card Extender Bracket 52 is mounted by Screws 54 to PCI Short Card 50. The PCI Short Card 50 and the attached Card Extender Bracket 52 is then mounted by Screws 56 to the Carrier Plate 14. As with the other card previously described, the Edge Connector 58 on the PCI Short Card 50 protrudes through the opening in the sidewall to coact with the connector mounted in the housing of the machine in which the assembly is inserted. Turning to FIG. 5, for the moment, the assembled short card is shown.

Figure 6:
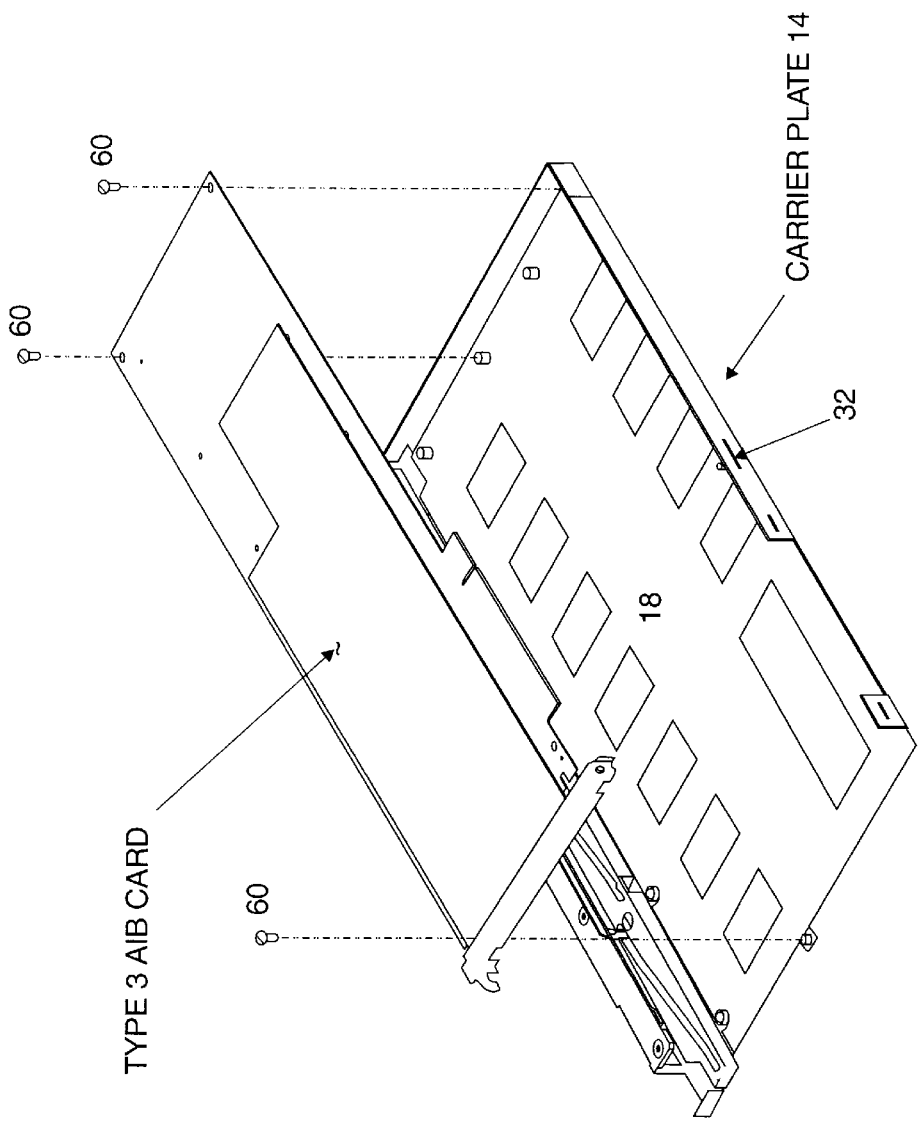
FIG. 6 shows a Type 3 AIB Card Assembly.

FIG. 6 shows a Type 3 AIB card assembly and Mounting Screws 60 for mounting the Type 3 AIB card to the Card Carrier Plate 14. As before, Insulator 18 insulates the Type 3 AIB card from the carrier plate. The flange 55 from card extender bracket 52 (FIG. 4) fits into slot 32 (FIG. 6).

The foregoing description of a preferred embodiment of the invention has been presented for the purposes of illustration and description. It is not intended to be exhaustive or to limit the invention to the precise form disclosed. Obvious modification or variations are possible in light of the above teachings. The embodiment was chosen and described to provide the best illustration of the principles of the invention and it's practical application, and to enable one of ordinary skill in the art to utilize the invention in various embodiment and with various modifications as are suited to particular use contemplated. Any such modifications and variations are within the scope of the invention as determined by the appended claims when interpreted in accordance with the breadth to which they are fairly, legally and equitably entitled.

What is claimed is:

1. A transportable universal carrier plate for use in positioning circuit cards in electrical machines including:

a planar member with sidewalls positioned along at least a first side and a second side of said planar member;

fasteners for mounting the planar member to a transport mechanism positioned at a third side;

a plurality of stand-offs, that mounts different types of circuit cards, positioned on said planner member; and an access opening fabricated in at least one of the sidewalls;

said access opening providing an outlet through which a connector section of the circuit card protrudes to mate with a connector in the electrical machine.

2. The transportable universal carrier plate of claim 1 wherein the stand-offs are threaded.

3. The transportable universal carrier plate of claim 1 further including a circuit card mounted on the planner member.

4. The transportable universal carrier plate of claim 1 further including an actuator bar/CAM slide mechanism connected to the planar member, said actuator bar/CAM slide mechanism being operable to position the universal carrier plate and an attached circuit board within a housing of an electrical machine so that a connector on the circuit board is aligned and inserted in a connector in the housing.

5. The transportable universal carrier plate of claim 1 further including a pair of openings for accommodating a first extender bracket fabricated in the at least one of the sidewalls on either side of the opening.

6. The transportable universal carrier plate of claim 1 or claim 5 further including a set of openings positioned in the at least one of the sidewalls, said set of openings being in spaced relationship on one side of the opening, said set of openings operatively accommodating another extender bracket.

7. The transportable universal carrier plate of claim 5 wherein the first extender bracket allows a first type of circuit cards to be mounted on said carrier plate.

8. The transportable universal carrier plate of claim 7 wherein the first type of circuit card includes PCI Type 5 AIB card.

9. The transportable universal carrier plate of claim 8 wherein the circuit card includes a PCI long card.

10. The transportable universal carrier plate of claim 8 further including an extender card operatively coupled to extend a connector section of said PCI Type 5AIB card.

11. The transportable universal carrier plate of claim 6 wherein the another extender bracket allows a second type of circuit cards to be mounted on said carrier plate.

12. The transportable universal carrier plate of claim 11 wherein the second type of circuit cards includes PCI short card.

13. The transportable universal carrier plate of claim 1 or claim 5 further including a liner mounted on the planar member.

14. The transportable universal carrier plate of claim 13 wherein a plurality of holes that provide cooling are fabricated in the liner and the planar member.

15. The transportable universal carrier plate of claim 13 wherein the planar member is metallic and the liner includes an electrical insulator.

16. The transportable universal carrier plate of claim 1 wherein the stand-offs are arranged and positioned to be in alignment with the holes on circuit cards supported by said carrier plate.

17. The transportable universal carrier plate of claim 16 wherein the stand-offs are arranged into multiple sets including a first set positioned at one end of the planar member, a second set positioned at an opposite ends of the planner member and a third set positioned at one side of the planar member.

18. The transportable universal carrier plate of claim 17 wherein the first set includes a single stand-off, the second set includes at least three stand-offs arranged in spaced relationship and the third set includes two stand-offs arranged in spaced relationship.

* * * * *